United States Patent
Meister et al.

(10) Patent No.: US 12,399,239 B1
(45) Date of Patent: Aug. 26, 2025

(54) HOLDING OF NMR MEASUREMENT SAMPLES IN A SPACE-RESTRICTED NMR SPECTROMETER

(71) Applicant: Bruker Switzerland AG, Fällanden (DE)

(72) Inventors: Roger Meister, Hinteregg (CH); Daniel Knecht, Volketswil (CH); Markus Mayer, Gossau (CH)

(*) Notice: Subject to any disclaimer, the term of this patent is extended or adjusted under 35 U.S.C. 154(b) by 0 days.

(21) Appl. No.: 18/998,906

(22) PCT Filed: Aug. 30, 2023

(86) PCT No.: PCT/EP2023/073811
§ 371 (c)(1),
(2) Date: Jan. 27, 2025

(87) PCT Pub. No.: WO2024/061584
PCT Pub. Date: Mar. 28, 2024

(30) Foreign Application Priority Data

Sep. 22, 2022 (DE) ............ 10 2022 210 010.7

(51) Int. Cl.
*G01R 33/31* (2006.01)
*G01R 33/30* (2006.01)

(52) U.S. Cl.
CPC ........... *G01R 33/31* (2013.01); *G01R 33/307* (2013.01)

(58) Field of Classification Search
CPC .............................. G01R 33/31; G01R 33/307
See application file for complete search history.

(56) References Cited

U.S. PATENT DOCUMENTS

| 7,248,050 B2 | 7/2007 | Hofmann et al. |
| 7,718,135 B2 | 5/2010 | Himmelsbach et al. |

(Continued)

FOREIGN PATENT DOCUMENTS

| CN | 105651802 | 6/2016 |
| CN | 108646204 | 10/2018 |

(Continued)

OTHER PUBLICATIONS

Staupunktströmung, [online], Wikipedia—The free encyclopedia, [retrieved on Apr. 18, 2023]. Retrieved from the Internet: https://de.wikipedia.org/w/index.php?title=Staupunktströmung&oldid=222731879.

(Continued)

*Primary Examiner* — G. M. A. Hyder
(74) *Attorney, Agent, or Firm* — Benoît & Côté Inc.

(57) ABSTRACT

An NMR spectrometer (10) with a permanent magnet device (11) with measurement volume (12) and bore (13) for inserting an NMR measurement sample contained in a sample tube (14), and with an RF coil (15) outside a cylindrical temperature control pipe (16) with a continuous annular air gap (17) through which temperature control gas can be conducted through a gas inlet (18), is characterized in that on the end opposite the gas inlet, a movable holding device (19) is installed which, in a first operating position, does not touch the sample tube, in a second operating position, holds the sample tube in its measuring position at its outer circumference in a force-fitting and/or form-fitting manner with an axially acting force or static friction $F_f$, and, in a third operating position, releases the sample tube for removal, and that in the second operating position $F_f > F_{dynamic} - F_{weight}$, where $F_{dynamic}$ is the buoyancy force generated by the dynamic pressure of the temperature control gas flowing onto the sample tube and $F_{weight}$ is the (Continued)

Figure 1:
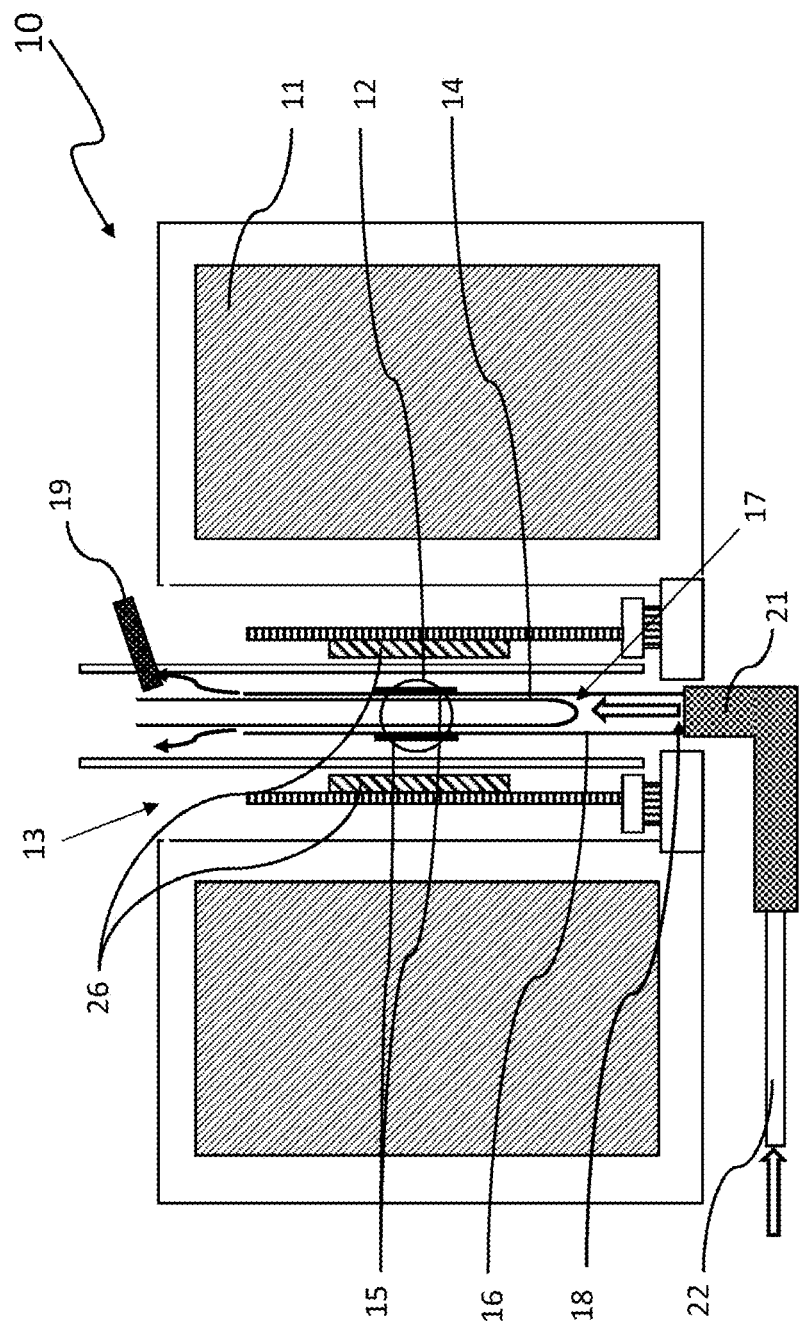

weight force of the sample tube. This enables the problems of known arrangements of the type in question with the dynamic pressure caused by the temperature control gas to be avoided.

15 Claims, 7 Drawing Sheets

(56) References Cited

U.S. PATENT DOCUMENTS

| | | | |
|---|---|---|---|
| 9,482,729 | B2 | 11/2016 | Gisler et al. |
| 10,436,859 | B2 | 10/2019 | Endo et al. |
| 10,782,369 | B2 | 9/2020 | Schmid et al. |
| 11,073,583 | B2 | 7/2021 | Meister et al. |
| 11,175,361 | B2 | 11/2021 | Huber et al. |
| 2002/0196023 | A1* | 12/2002 | Hofmann .............. G01R 33/30 324/318 |
| 2016/0077176 | A1 | 3/2016 | Rabinovitz et al. |
| 2018/0259602 | A1 | 9/2018 | Endo et al. |
| 2019/0072625 | A1 | 3/2019 | Meister et al. |
| 2019/0317162 | A1 | 10/2019 | Schmid et al. |
| 2022/0171004 | A1 | 6/2022 | Freytag et al. |

FOREIGN PATENT DOCUMENTS

| | | |
|---|---|---|
| CN | 109471052 | 3/2019 |
| DE | 102006006705 A1 | 8/2007 |
| DE | 102004029633 B4 | 1/2012 |
| DE | 102012217601 A1 | 3/2014 |
| DE | 102016203891 A1 | 9/2017 |
| DE | 102018205535 B3 | 7/2019 |
| DE | 102019212508 A1 | 2/2021 |
| EP | 3561533 B1 | 1/2021 |
| EP | 3715893 B1 | 2/2021 |

OTHER PUBLICATIONS

Bruker Fourier 80 NMR Benchtop spectrometer (User manual as of Aug. 12, 2020, device also abbreviated called "F80").

* cited by examiner

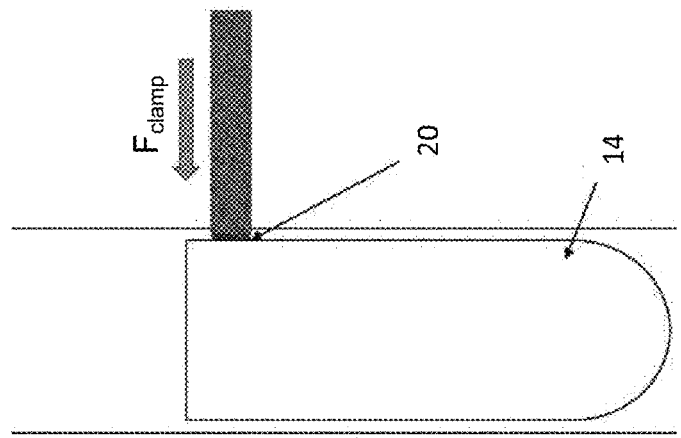
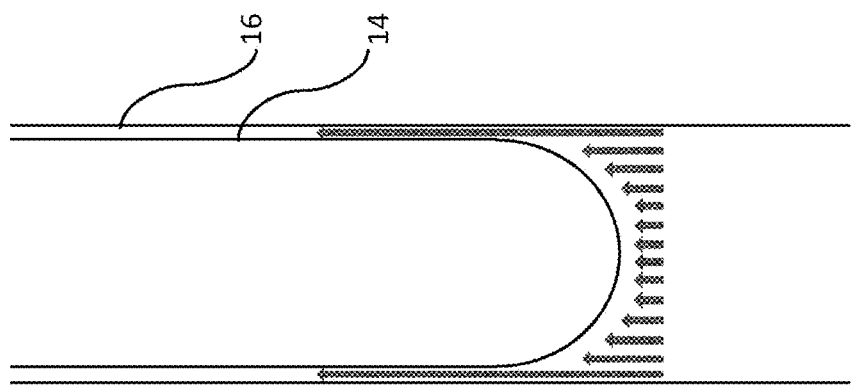
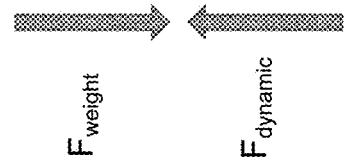

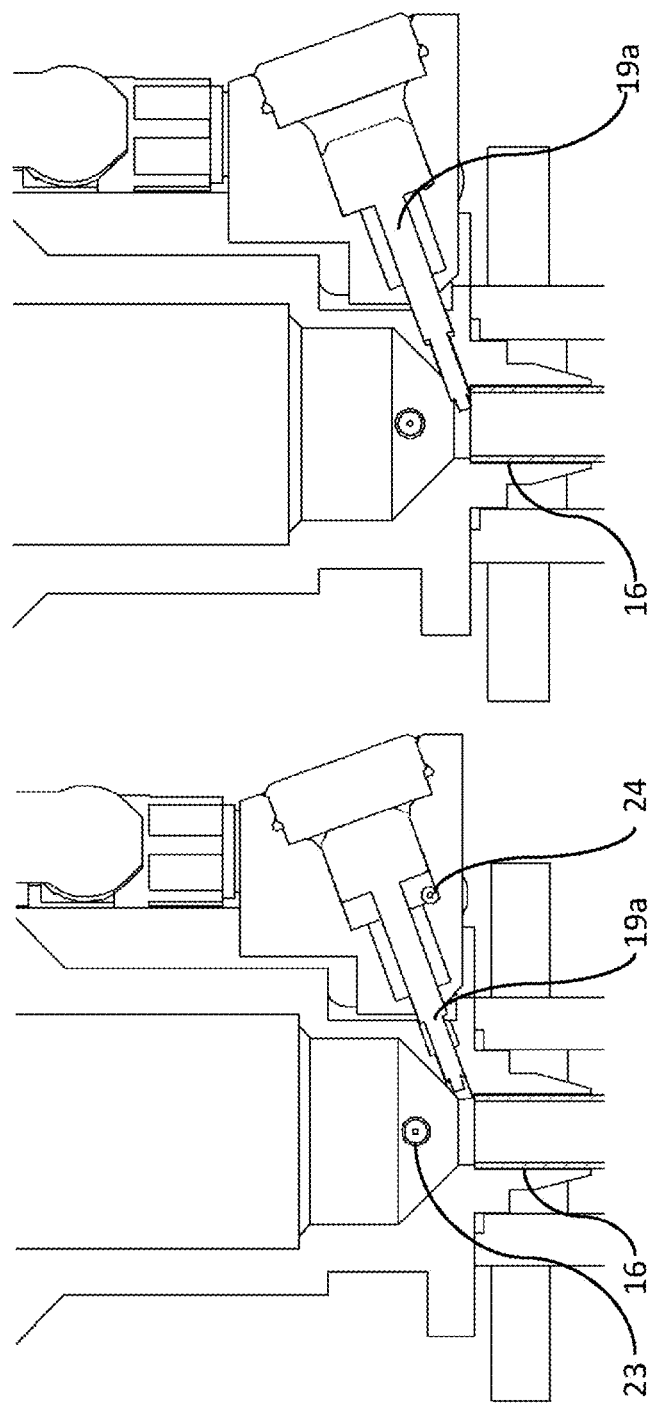

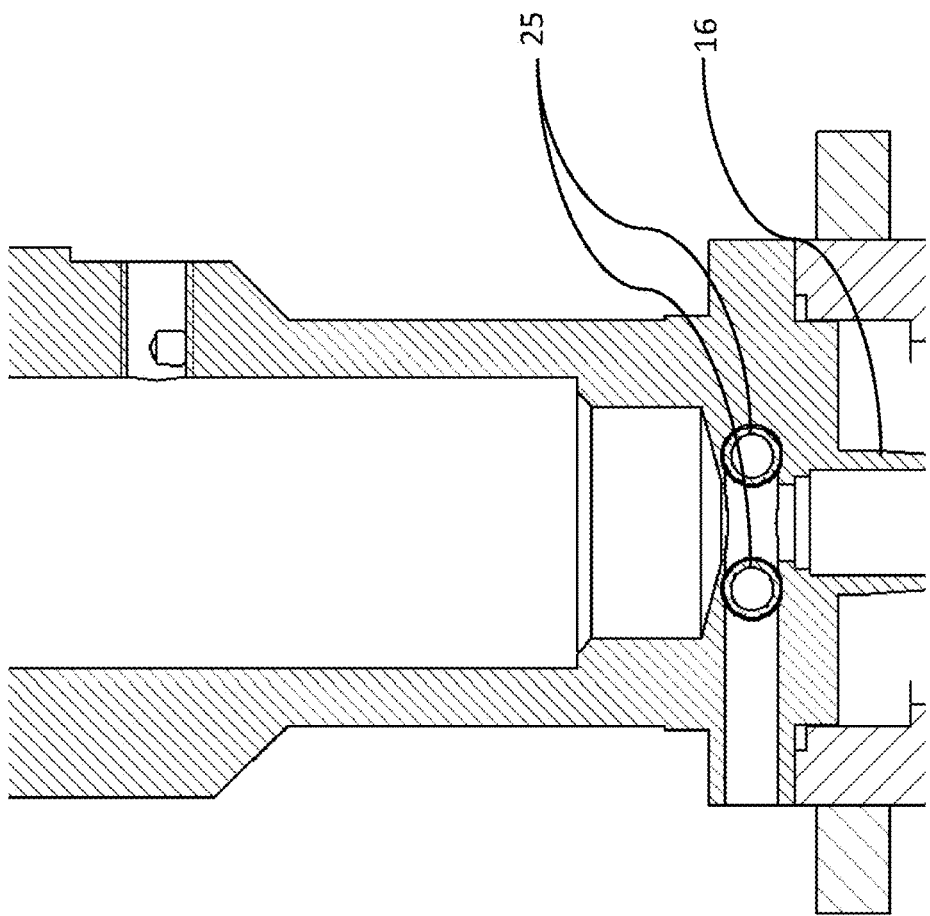

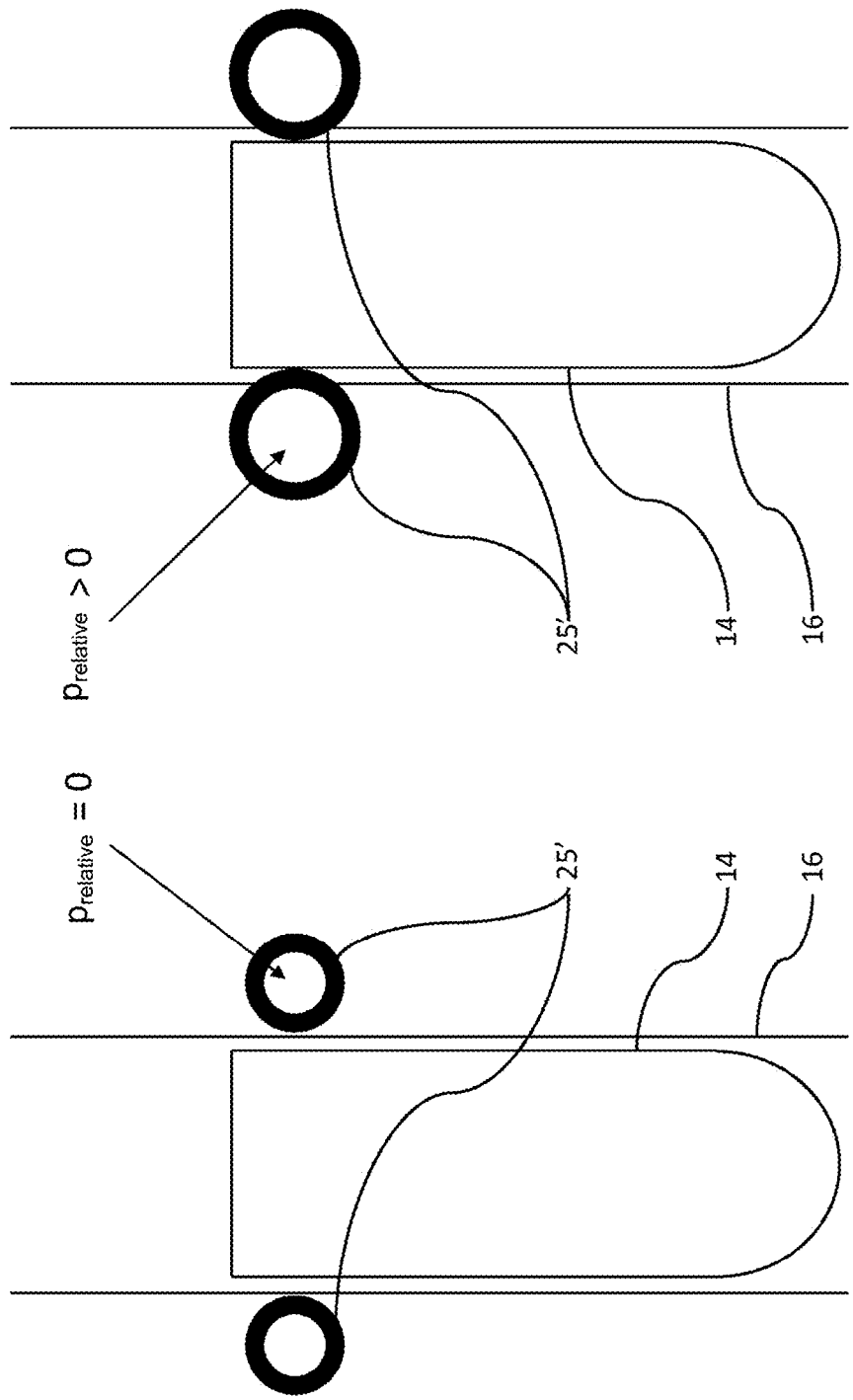

HOLDING OF NMR MEASUREMENT SAMPLES IN A SPACE-RESTRICTED NMR SPECTROMETER

The invention relates to an NMR spectrometer with an NMR magnet system, which has a permanent magnet device for generating a $B_0$ field in a measurement volume and a bore through the magnet center for introducing an NMR measurement sample in a substantially cylindrical sample tube that is closed at least on its underside, and with an RF coil for exciting the nuclear spins in the NMR measurement sample, wherein the RF coil is arranged outside a cylindrical temperature control pipe that runs through the measurement volume and into which the sample tube can be introduced for an NMR measurement in such a way that there is a continuous annular air gap between the inner circumference of the cylindrical temperature control pipe and the outer circumference of the sample tube, through which temperature control gas for temperature control of the NMR measurement sample in the sample tube can be passed from a temperature control system through a gas inlet, at least during NMR measurement operation.

Such an NMR spectrometer with a permanent magnet arrangement and a device for temperature control of the NMR sample by means of temperature control gas is known from DE 10 2019 212 508 A1 (=reference [1]).

DE 10 2004 029 633 B4 (=reference [2]) already describes an NMR apparatus with an NMR spectrometer for the sequential examination of a plurality of NMR measurement samples that are pneumatically fed from a magazine in a refrigeration cabinet into the measuring position in the spectrometer and that are brought precisely to the desired higher measurement temperature during transport in a feed line.

A transport device for the pneumatic transport of NMR measurement samples that are temperature-controlled during the measurement from a region outside an NMR spectrometer through a tubular transport channel into the NMR spectrometer and from there-after carrying out an NMR measurement on the NMR measurement samples-back outside the NMR spectrometer is described in DE 10 2018 205 535 B3 (=reference [3]).

An NMR spectrometer with a quick-change system for the NMR measurement samples is known from EP 3 715 893 B1 (=reference [4]).

U.S. Pat. No. 10,436,859 B2 (=reference [5]) describes a device and a method for introducing NMR measurement samples into an NMR spectrometer and for removing them from the spectrometer by means of pressurized gas.

EP 3 561 533 B1 (=reference [6]) discloses an NMR measurement sample which is introduced into an NMR spectrometer for NMR measurement and then removed again. During the measurement, the sample is kept at a desired temperature by various thermal shields and by means of temperature control gas.

BACKGROUND OF THE INVENTION

The present invention relates in general to the temperature control of NMR measurement samples during operation, in particular for benchtop NMR devices with permanent magnet systems. With permanent magnets, the magnetic field generated depends on the ferromagnetic properties of the permanent magnet material used. These properties, in turn, are strongly temperature-dependent. For high-resolution NMR with sub-Hertz line widths, it is important to thermally control the permanent magnet arrangement very precisely to avoid drift or fluctuation of the B0 field, which can lead to resonance line broadening when accumulating spectra to increase the signal-to-noise ratio (S/N), or distortions of line shapes when the magnetic field strength changes over the time duration of an acquisition.

In NMR benchtop spectrometers, the NMR measurement samples are therefore temperature-controlled using a gas stream, currently between 25° C. and 60° C. This function is called "Adjustable Temperature" (="AT" or "AT gas stream") in the devices.

The central problem with this benchtop design with permanent magnets is the very limited space available for automation. This makes it necessary to route all supply lines for radio frequency (RF), shim system, and lock sample into the air gap between the magnetic poles. However, the air gap is relatively narrow due to the homogeneity requirements of the NMR magnetic field.

In addition, the use of permanent magnets in NMR spectroscopy requires very precise temperature control of the NMR magnets, since even the slightest temperature fluctuations lead to a field drift and the spectrometer changes the resonance frequency (see also reference [1]). This means that between the NMR sample, which is measured for example at 60° C., and the B0 magnet, which is typically kept at room temperature, ideally at millikelvin, there is a distance of only 6 mm, in which a there is a temperature gradient of >30K.

The temperature control of the NMR sample is achieved by a so-called "direct flow." This means that an AT gas stream conditioned to the desired temperature flows directly around the NMR sample. With the "direct flow" principle, the temperature control gas is guided directly between the NMR sample and the smallest tubing from bottom to top.

Due to the very small gap of 0.1-0.3 mm between the NMR sample and the smallest tubing, the air channel is very thin. Through this thin channel, a dynamic pressure is created due to the temperature control air below the NMR sample. This dynamic pressure causes the NMR sample to be lifted from its measuring position in the NMR spectrometer.

The reference [1] cited at the beginning describes a generic arrangement with the features mentioned at the beginning, as well as a method for generating a homogeneous magnetic field. However, reference [1] does not address the problem of dynamic pressure caused by the temperature control gas described above and does not offer any remedy for this.

OBJECT OF THE INVENTION

In contrast, the object of the present invention is that of improving a temperature control system for an NMR magnet system of the type described above using the simplest technical means possible so as to avoid the above-discussed disadvantages with the dynamic pressure due to the AT temperature control gas in known assemblies of the type in question.

BRIEF DESCRIPTION OF THE INVENTION

This object is achieved by the present invention in a surprisingly simple and effective manner in that, in an NMR spectrometer of the type defined at the outset, a holding device that is movable relative to the sample tube in its measuring position is installed in the NMR spectrometer at the end of the sample tube that is opposite the gas inlet during NMR measurement operation, that the holding device is designed such that in a first operating position it does not touch the sample tube in order to enable it to be introduced into its measuring position in the NMR spectrometer, that in a second operating position it holds the sample tube in its measuring position on its outer circumference for carrying out the NMR measurement in a force-fitting and/or positively-fitting manner with a force or static friction $F_f$ acting axially on the sample tube, and that in a third operating position it releases the sample tube again for removal from the NMR spectrometer, and that the holding device is designed such that in the second operating position $$F_f > F_{dynamic} - F_{weight},$$

where $F_{dynamic}$ is the buoyancy force on the sample tube generated by the dynamic pressure of the temperature control gas flowing onto the sample tube in NMR measurement operation, and $F_{weight}$ is the weight force of the sample tube.

The main object of the present invention is to ensure a secure spatial fixation of the NMR measurement sample in its measurement position during NMR measurement operation using the simplest possible means.

This aim is achieved according to the invention in particular by a very specifically designed movable holding element which holds the NMR measurement sample in position at its circumference by means of a force fit or a positive fit.

The present invention can be used particularly advantageously in NMR spectrometers with a permanent magnet device for generating a B0 field in the measurement volume. Such a spectrometer usually includes a temperature control device in order to the NMR measurement samples to be measured using an AT gas stream, which is blown onto the corresponding NMR measurement sample from below at a sufficient flow rate so that no temperature gradient is formed in the NMR measurement sample.

The AT gas stream is fed into the spectrometer via a hose or pipe connection and brought to the desired temperature within the spectrometer. In the spectrometer itself, the AT gas stream is passed through a Dewar, which isolates the temperature-sensitive electronics and the magnetic field-generating components from the AT gas stream. The AT gas stream is fed into a tube or coil glass which surrounds the NMR measurement sample and on which the coil generating a B1 field is arranged.

Due to the limited installation space, there is only a small distance between the NMR sample and the coil glass (0.1 mm-0.5 mm). There, a holding device for the NMR measurement sample is arranged, which holds the NMR measurement sample in the measuring position, despite the strong AT temperature control gas flow. The holding device clamps the NMR measurement sample, usually an NMR tube, in such a way that the dynamic pressure $F_{dynamic}$ cannot move the NMR measurement sample axially or even eject it.

PREFERRED EMBODIMENTS AND DEVELOPMENTS OF THE INVENTION

In particularly advantageous embodiments of the invention, the third operating position of the sample tube coincides identically with the first operating position, which then makes the NMR apparatus even more compact, simplifies it further and thus reduces the manufacturing costs.

An embodiment of the NMR spectrometer according to the invention is particularly preferred which is characterized in that the holding device is designed such that a contact surface between the sample tube and the holding device has a coefficient of friction $\mu > 0.3$, and that $$F_f = \mu * F_{clamp},$$

where $F_{clamp}$ is the clamping force acting radially on the sample tube and u is the coefficient of friction.

The coefficient of friction must be sufficiently high to generate a significant axial force. The higher the coefficient of friction, the lower the clamping force can be. An appropriate material pairing can be e.g., glass with rubber elastomer or silicone elastomer.

Also advantageous are embodiments of the invention in which the continuous annular air gap between the inner circumference of the cylindrical temperature control pipe and the outer circumference of the sample tube in the measurement position of the sample tube has a radial opening width between 0.1 mm and 1 mm, preferably between 0.15 mm and 0.3 mm.

The NMR coil has to be as close to the sample as possible. Every tenth of a millimeter changes the sensitivity of the spectrometer.

Further advantageous embodiments of the invention are characterized in that the temperature control gas has a volume flow of at least 1 l/min and a maximum of 20 l/min, preferably 3.5 l/min to 12 l/min, during the NMR measurement operation of the NMR spectrometer.

The large volume flow results in the sample tube being pushed out by the dynamic pressure. However, a minimum volume flow is required to reduce the temperature control time of the NMR sample and to avoid or at least minimize a temperature gradient in the measurement sample.

One class of embodiments of the invention is characterized in that a sample changer is provided for the automated feeding of the NMR spectrometer with sample tubes, which comprises a storage container for storing a plurality of sample tubes and a device for transferring and removing the sample tubes into or from the measurement volume.

This is used for unsupervised automated operation, possibly also for high throughput.

In preferred developments of this class of embodiments, the holding device simultaneously acts as a device for transferring and removing sample tubes, and the NMR spectrometer and the sample changer are preferably components of an automatic system with a robot gripper arm.

A separate holding device is then not required, since the gripper arm is at the same time the holding device.

Also advantageous are embodiments of the NMR spectrometer according to the invention which are characterized in that a Dewar is present which at least partially surrounds a line leading from the temperature control system to the gas inlet.

The Dewar is important because the spectrometer is highly sensitive to temperature changes. In particular, the permanent magnet should not deviate from the operating temperature. However, electronic components and the shim system are also temperature-controlled, and in a very small installation space.

All the electronics must be insulated from temperature fluctuations as much as possible. Ideally, the Dewar extends all the way to the sample so that the AT gas flow is insulated from the electronics. Heating is preferably done in the Dewar itself, e.g., with a heating coil. In combination with cooled air ($N_2$) supplied from outside, the temperature of the AT gas flow can be adjusted.

A further class of embodiments of the invention is characterized in that a first sensor element is provided for determining the presence of the sample tube within the NMR spectrometer.

Preferably, this sensor element is used to check that the sample tube has correctly assumed the measuring position, possibly in conjunction with a marking on the sample tube.

This feature serves to ensure the reproducibility of measurements in automatic operation, because the correct positioning of the sample in the measurement region is essential for NMR measurements. It is also important to detect the absence of the measurement sample before loading a new one so that the sample tubes in the spectrometer do not collide and thus break.

In preferred developments of this class of embodiments, a further sensor element is provided for determining the current operating position of the holding device.

The additional sensor element must register that the sample is fixed in its measuring position. In addition, the sensor indicates that the retaining pin is currently retracted so as not to block the loading of a measurement sample.

Alternatively or additionally, in other embodiments of the invention, the holding device can comprise a holding piston which can be subjected to a force by means of compressed air or motor drives, which then displaces the holding piston against a restoring force, in particular the spring force of a return spring against the sample tube.

The return spring keeps the holding device in a preferred position when there is no compressed air supply. The position can be selected: either in the clamping position or retracted.

An advantageous further development of these embodiments is characterized in that the holding piston has a retaining pin which can come into direct mechanical contact with the outer circumference of the sample tube.

By using a retaining pin, the material (usually an elastomer) that holds the sample tube can be freely selected. The holding piston itself must be made of a firm material, i.e., with a higher modulus of elasticity, because of the application of compressed air.

A first group of embodiments of the invention is particularly simple in construction, in which the holding device comprises holding cheeks which can clamp at least parts of the outer circumference of the sample tube in a tong-like manner, wherein the holding cheeks are preferably designed as a chuck or as two half-shells which can hold the sample tube on its outer circumference from both sides.

This results in a symmetrical contact pressure force on the holding cheeks and the sample tube is well centered.

A second group of embodiments of the NMR spectrometer according to the invention is characterized in that the holding device comprises an iris diaphragm.

A symmetrical contact pressure force through the iris diaphragm is also advantageous. The sample tube is centered even better than with the holding cheeks.

In a third group of embodiments, the holding device has an adjusting element which, in the second operating position, prevents the sample tube from moving out of the measuring position in the axial direction in a lid-like manner over the end of the sample tube opposite the gas inlet.

For example, the adjusting element can be extended and retracted in the radial direction to the z-axis of the NMR apparatus.

The actuating force on the adjusting element is lower because it only holds in the axial direction. Furthermore, it is independent of the dynamic pressure due to the positive fit.

Finally, a fourth group of embodiments is characterized in that the holding device comprises pneumatically actuatable, in particular inflatable, elements which can apply radial pressure to the sample tube in its measuring position.

In principle, this variant does not require any moving parts. The balloon clamps the sample tube itself. Compared to the variants mentioned above, very few components are required.

A particularly simple further development of this group of embodiments is characterized in that the holding device comprises highly elastic tubes, e.g., made of silicone or other elastomers, which are arranged in a cheek-like or ring-shaped manner around the sample tube in its measuring position, or an inflatable O-ring arranged radially around the outer circumference of the sample tube.

A good coefficient of friction with glass is advantageous here. The hoses are applied uniformly on the tube. This results in a large contact area and particularly good centering of the sample tube.

Typically, the RF coil will simply be mounted on the outer surface of the cylindrical temperature control pipe, where it requires little additional space.

Preferably, the NMR spectrometer according to the invention will contain at least one shim coil for generating an H0 field, which surrounds the RF coil at a radial distance and is temperature-controlled, in particular with its own temperature control system.

The scope of the present invention also includes a method for operating an NMR spectrometer according to the invention having a sample changer of the type described above, characterized by the following steps:

(a) moving the holding device into the first operating position;
(b) inserting a sample tube containing an NMR sample through the hole to its measurement position in the measurement volume;
(c) detecting the presence of the sample tube in the measuring position by means of the first sensor element;
(d) fixing the sample tube using the holding device;
(e) checking the current presence of the second operating position of the holding device using the further sensor element;
(f) release of a temperature control gas stream for temperature control of the NMR sample;
(g) performing an NMR measurement on the NMR measurement sample;
(h) moving the holding device to the third operating position and removing the sample tube from the spectrometer.

This allows error-free and safe automation without the presence of measurement personnel. The reproducibility of the measurements is ensured because the positioning sensors and the correct temperature control make identical measurement conditions possible for each sample in a series of measurements. This is essential for measurements in certified procedures (GXP) and prevents incorrect operation.

Further advantages of the invention are found in the description and the drawing. Likewise, the features mentioned above and those detailed below can be used according to the invention individually or collectively in any combination. The embodiments shown and described are not to be understood as an exhaustive list, but rather have an exemplary character for the description of the invention.

DETAILED DESCRIPTION OF THE INVENTION AND DRAWINGS

The invention is illustrated in the drawings and will be explained in more detail with reference to embodiments.

In the drawings:

FIG. 1 shows a schematic vertical sectional view of an embodiment of the NMR spectrometer according to the invention;

FIG. 2*a* shows a schematic vertical section through the lower part of the sample tube in the temperature control pipe to illustrate the dynamic pressure and the condition according to the invention:

$$F_f > F_{dynamic} - F_{weight};$$

Figure 3A:
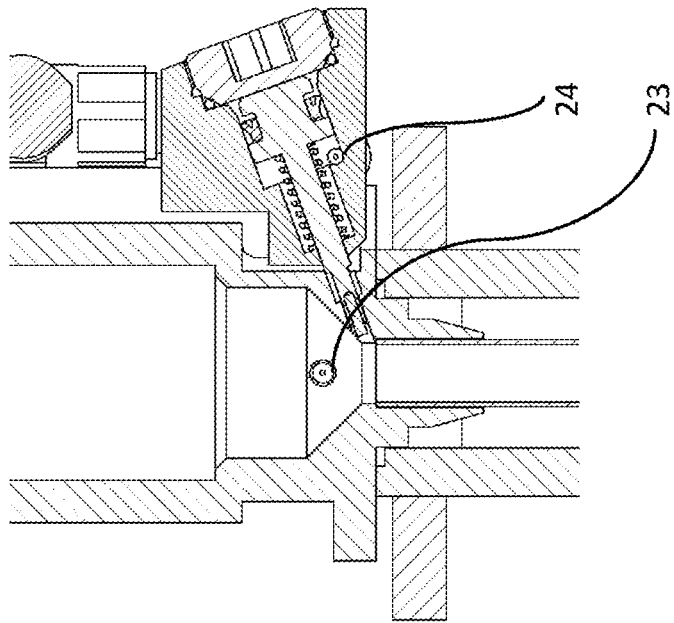
Figure 3B:
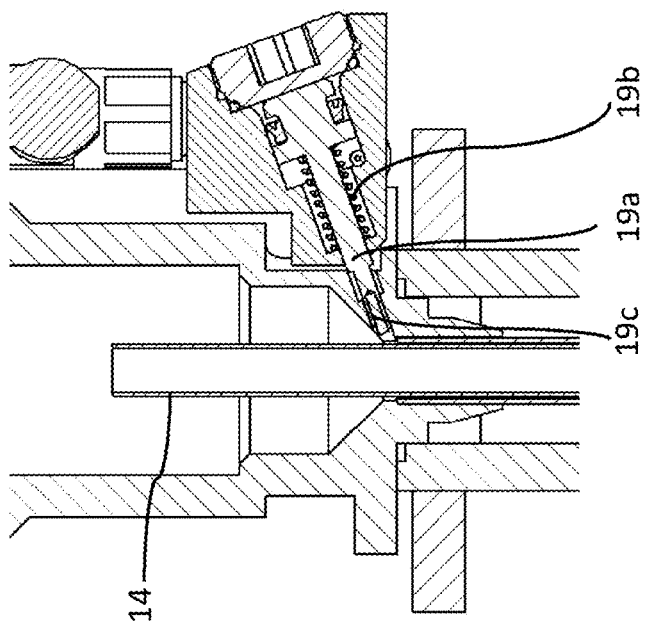
Figure 7:
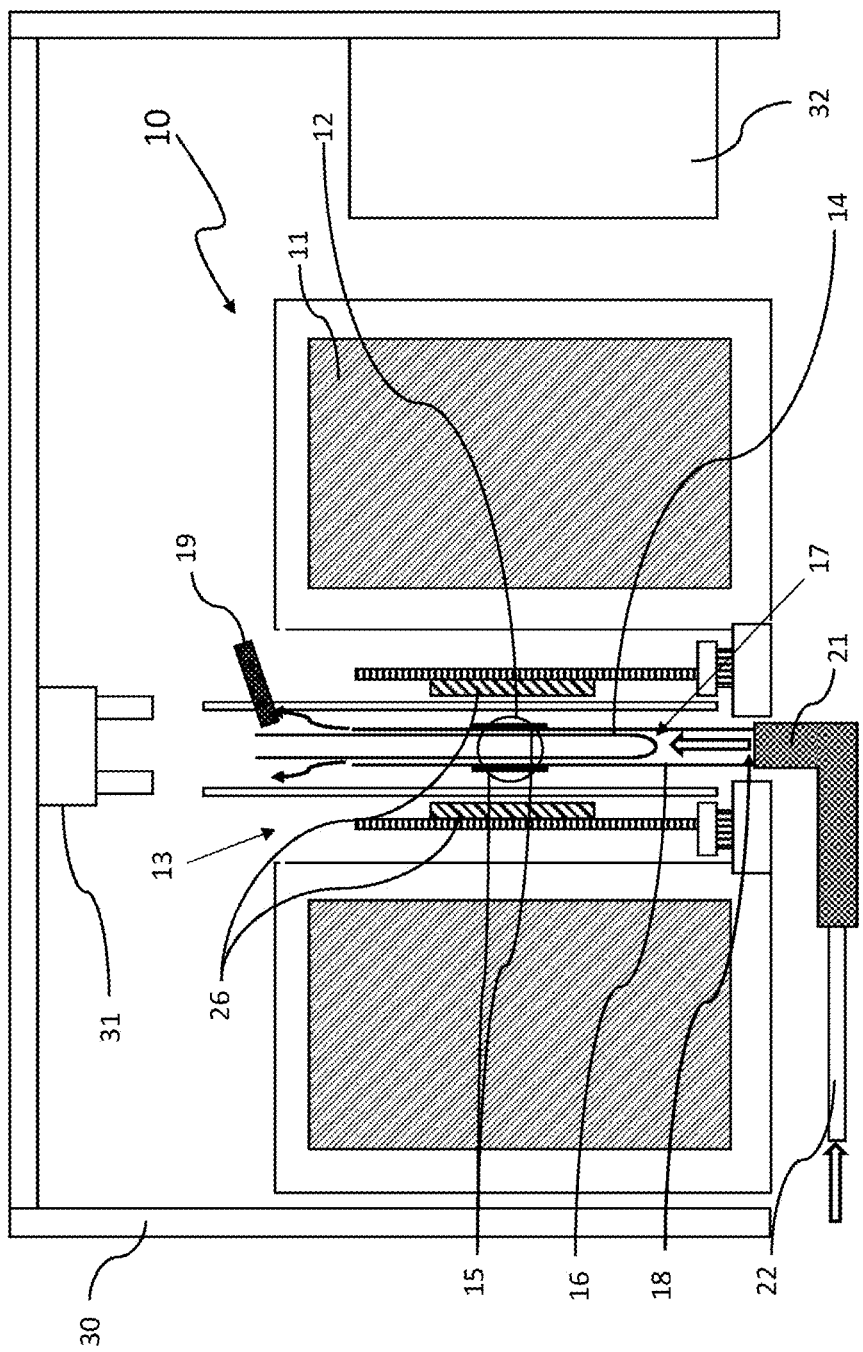

FIG. 2*b* shows a schematic vertical section through the sample tube (shown in abbreviated form) in the temperature control pipe to illustrate the radial clamping of the sample tube on a contact surface of the holding device due to sliding friction;

FIG. 3*a* shows a vertical section through the upper part of the sample tube in the temperature control pipe with an embodiment of the holding device according to the invention with holding piston, return spring, and retaining pin;

FIG. 3*b* as FIG. 3*a*, but without sample tubes to make the first and further sensor elements visible;

FIG. 4*a* as FIG. 3*b*, but with fewer details and with the holding piston in the retracted operating position to allow the passage of a sample tube;

FIG. 4*b* as FIG. 4*a*, but with fewer details and with the holding piston in the extended operating position for holding a sample tube (not shown here) in the temperature control pipe;

FIG. 5 shows a vertical section through the upper part of the temperature control pipe without an inserted sample tube with an embodiment of the holding device, which here comprises a pneumatically inflatable O-ring;

FIG. 6*a* shows a schematic vertical section through the sample tube (shown in abbreviated form) in the temperature control pipe with a further embodiment of the holding device with inflatable O-ring, here in the non-inflated operating state for the passage of the sample tube;

FIG. 6*b* as FIG. 6*a*, but with the O-ring in the inflated operating state to hold the sample tube in the temperature control pipe; and FIG. 7 as FIG. 1, but with the NMR spectrometer according to the invention as well as a sample changer and a robot gripper arm as components of an automated system.

FIGS. 1 to 7 of the drawing each show, in schematic views with different levels of detail, preferred embodiments of the NMR spectrometer 10 according to the invention.

Such an NMR spectrometer 10 comprises a permanent magnet arrangement 11 for generating a $B_0$ field in a measurement volume 12 with a bore 13 through the magnet center for introducing an NMR measurement sample in a substantially cylindrical sample tube 14 that is closed at least on its underside, with a shim system 26 and with an RF coil 15 for exciting the nuclear spins in the NMR measurement sample, wherein the RF coil 15 is arranged outside a cylindrical temperature control pipe 16 that runs through the measurement volume 12 and into which the sample tube 14 can be introduced for an NMR measurement in such a way that between the inner circumference of the cylindrical temperature control pipe 16 and the outer circumference of the sample tube 14 there is a continuous annular air gap 17 through which, at least in NMR measurement mode, temperature control gas can be conducted from a temperature control system through a gas inlet 18 for temperature control of the NMR sample in the sample tube 14. A fluid line 22 to the gas inlet 18 conducts the temperature control gas through a dewar 21. The temperature control gas is driven by a pump device of the NMR spectrometer 10 (not specifically shown in the drawing).

The present invention improves this known NMR apparatus and extends it with elements essential to the invention:

The NMR spectrometer 10 according to the invention is characterized in that a holding device 19 that is movable relative to the sample tube 14 in its measuring position is installed in the NMR spectrometer 10 at the end of the sample tube that is opposite the gas inlet 18 during NMR measurement operation, that the holding device 19 is designed such that in a first operating position it does not touch the sample tube 14 in order to enable it to be introduced into its measuring position in the NMR spectrometer 10, that in a second operating position it holds the sample tube 14 in its measuring position on its outer circumference for carrying out the NMR measurement in a force-fitting and/or positively-fitting manner with a force or static friction $F_f$ acting axially on the sample tube 14, and that in a third operating position it releases the sample tube 14 again for removal from the NMR spectrometer 10, and that the holding device 19 is designed such that in the second operating position $$F_f > F_{dynamic} - F_{weight};$$

where $F_{dynamic}$ is the buoyancy force on the sample tube 14 generated by the dynamic pressure of the temperature control gas flowing onto the sample tube 14 in NMR measurement operation, and $F_{weight}$ is the weight force of the sample tube 14.

A first, particularly simple embodiment of the invention is shown highly schematically in FIG. 1:

A secure spatial fixation of the sample tube 14 during the NMR measurement is achieved with the movable element of a holding device 19, which element is specially developed for this purpose and designed according to the principles of the invention. Preferably, the fixation takes place at the upper end of the sample tube 14, in any case not in the measurement region, i.e., not in the measurement volume 12. The holding device 19 thus comprises a movable element that can be moved into and out of the sample channel, through which sample tubes 14 are introduced into the measurement volume 12 for NMR measurement and then removed again. If a sample tube 14 is located in the sample head of the NMR spectrometer 10, the sample tube 14 is clamped by the retraction of the movable element and is thus held in its measuring position.

A sufficiently large holding force is achieved by a corresponding retraction force of the movable element and of a friction surface (with the highest possible coefficient of static friction).

FIG. 2*a* shows, in a highly schematic vertical section through the lower part of the sample tube 14 in the temperature control pipe 16, the temperature control gas flowing onto the sample tube 14 from below. This causes a corresponding dynamic pressure at the sample tube 14. However, in order to prevent the sample tube 14 from being pressed upward out of the measurement volume 12 during the NMR measurement by this permanently existing dynamic pressure, in NMR spectrometers according to the prior art the weight force $F_{weight}$ of the sample tube 14 must not be less than the pressure force $F_{dynamic}$ acting on the sample tube 14 from below due to the dynamic pressure. On the other hand, however, the weight force $F_{weight}$ also must not be greater than the pressure force $F_{dynamic}$, because otherwise—at least without further measures—the sample tube 14 would fall downwards out of the measurement volume 12. In the prior art, the dynamic pressure is therefore usually regulated by adjusting the volume flow of the temperature control gas in such a way that the sample tube 14 is held just suspended in its measuring position, i.e., $F_{dynamic} \approx F_{weight}$. However, this then eliminates the parameter of the temperature control gas volume flow for optimizing the temperature control of the sample tube 14.

However, due to the design according to the invention of the novel holding device 19, the important process parameter of the temperature control gas volume flow can be varied within wide limits in order to optimize the temperature control of the sample tube 14, while complying with the inventively prescribed condition $F_f > F_{dynamic} - F_{weight}$ for the holding force or static friction $F_f$ acting on the sample tube 14. As a result, in practice the volume flow of the temperature control gas during the NMR measurement operation of the NMR spectrometer 10 can now be freely adjusted within a wide range, between approximately 1 l/min and up to 20 l/min, preferably between 3.5 l/min and 12 l/min.

The radial opening width of the continuous annular air gap 17 between the inner circumference of the cylindrical temperature control pipe 16 and the outer circumference of the sample tube 14 in the measuring position of the sample tube 14 is generally selected between 0.1 mm and 1 mm, preferably between 0.15 mm and 0.3 mm, in the NMR spectrometer 10 according to the invention.

FIG. 2b illustrates, again in a highly schematic vertical section through the sample tube 14 (shown here in abbreviated form) in the temperature control pipe 16, the radial clamping of the sample tube 14 on a contact surface 20 of the holding device 19 due to sliding friction. Here a clamping force $F_{clamp}$ acts radially on the sample tube 14. For a coefficient of friction μ, the following must therefore apply to the arrangement according to the invention:

$$F_f = \mu * F_{clamp}.$$

The holding device 19 according to the invention is preferably designed such that the contact surface 20 between the sample tube 14 and the holding device 19 has a coefficient of friction μ>0.3.

In FIG. 3a, a further embodiment of the holding device 19 according to the invention is shown in a vertical section through the upper part of the sample tube 14 in the temperature control pipe 16. This embodiment of the holding device 19 according to the invention comprises a holding piston 19a, a return spring 19b and a retaining pin 19c.

The holding piston 19a can be subjected to a force by means of compressed air or motor gears, which moves the piston toward the sample tube 14 against the spring force of the return spring 19b and presses it against it with the retaining pin 19c.

In order to detect the correct positioning of the sample tube 14 in the measurement space, a first sensor element 23 is provided for determining the presence of the sample tube 14 within the NMR spectrometer 10, as can be seen in FIG. 3b. FIG. 3b shows the same detail of the NMR apparatus as FIG. 3a, but without the sample tube, for better visualization of the sensor elements. Preferably, the first sensor is attached in such a way that the loading situation with the sample tube 14 can be determined reliably and without doubt. For example, the sensor can comprise a light barrier.

A further sensor element 24 for determining the current operating position of the holding device 19 is also shown in FIG. 3b. This second sensor indicates when the retaining pin 19c is fully extended and is in the operating position in which it presses against the sample tube 14 and holds it in position by clamping it. Only when this positioning confirmation is indicated by the second sensor can the AT gas stream be released, since otherwise the sample tube 14 cannot be positioned correctly.

FIG. 4a shows the same situation as FIG. 3b, but with fewer details and with the holding piston 19a in the retracted operating position to allow the passage of a sample tube 14 (again not shown here).

FIG. 4b shows the same apparatus components as FIG. 4a, but with the holding piston 19a in the extended operating position for holding a sample tube 14 (again not shown here for reasons of better visibility) in the temperature control pipe 16.

In a group of further embodiments of the invention (not shown in the drawing) the holding device 19 can comprise holding cheeks which can clamp at least parts of the outer circumference of the sample tube 14 in a tong-like manner, wherein the holding cheeks are preferably designed as a chuck or as two half-shells which can hold the sample tube 14 on its outer circumference from both sides.

The advantage of these designs of the holding device is that the sample tube 14 can be held better centered in the middle of the coil glass. However, a mechanism for tongs requires somewhat more space.

In a further group of embodiments (not shown), the holding device 19 comprises an iris diaphragm.

Furthermore, the holding device 19 can also have an adjusting element which, in the second operating position, prevents the sample tube 14 from moving out of the measuring position in the axial direction in a lid-like manner over the end of the sample tube 14 opposite the gas inlet 18.

In a further group of alternative embodiments—as shown in FIG. 5 in a vertical section through the upper portion of the temperature control pipe 16 without the sample tube 14 inserted—the holding device 19 can comprise pneumatically actuatable elements 25 which can in particular be inflatable and apply radial pressure to the sample tube 14 in its measuring position.

The holding element is designed as a tube (here specifically as a pneumatically inflatable O-ring) that is guided around the sample tube. For the clamping, the tube is charged with compressed air. This causes the tube to expand and fixes the sample tube in its measuring position.

FIGS. 6a and 6b each show a schematic vertical section through the sample tube 14 (shown here in abbreviated form) in the temperature control pipe 16 with a further embodiment of the holding device according to the invention with inflatable O-ring 25', here in the non-inflated operating state for the passage of the sample tube FIG. 6a shows the pneumatically actuatable element 25' in the non-inflated operating state for the passage of the sample tube 14, while in FIG. 6b the O-ring 25' is shown in the inflated operating state for holding the sample tube 14 in the temperature control pipe 16. The inflatable tube can therefore be seen in FIG. 6a without compressed air compared to the ambient pressure ($p_{relative}=0$) and in FIG. 6b with compressed air ($p_{relative}>0$). By expanding the tube, which is arranged in a ring around the sample tube 14, a holding force is generated on the sample tube 14, which holds the NMR tube stationary in the AT temperature control stream.

In all variants of the invention presented above, the holding device 19 can be driven manually, mechanically, electrically, magnetically or pneumatically.

Finally, FIG. 7 shows (in addition to FIG. 1) a sample changer 32 for the automated feeding of the NMR spectrometer 10 with sample tubes 14, which comprises a storage container for storing a plurality of sample tubes and a device for transferring and removing the sample tubes 14 into the measurement volume 12 or from the measurement volume 12. A sample changer within the meaning of the present invention is normally arranged on the top of the NMR spectrometer 10 and is equipped to feed the spectrometer with different NMR tubes from a storage container and to remove them from the measurement volume 12 after the measurement.

In the illustrated embodiment, the holding device 19 simultaneously acts as a device for transferring and removing sample tubes 14. The NMR spectrometer 10 and the sample changer 32 are here components of an automated system 30 with a robot gripper arm 31.

The features of all the above-described embodiments of the invention may also be combined with one another at least in most cases.

LIST OF REFERENCES

Documents taken into consideration for the assessment of patentability
[1] DE 10 2019 212 508 A1
[2] DE 10 2004 029 633 B4
[3] DE 10 2018 205 535 B3≈EP 3 561 533 B1≈U.S. Pat. No. 10,782,369 B2
[4] EP 3 715 893 B1≈ZL 2020 1 0210645.3≈U.S. Pat. No. 11,073,583 B2
[5] U.S. Pat. No. 10,436,859 B2
[6] EP 3 561 533 B1

LIST OF REFERENCE SIGNS

10 NMR spectrometer
11 Permanent magnet device
12 Measurement volume
13 Magnet bore
14 Sample tube
15 RF coil
16 Temperature control pipe
17 Annular air gap
18 Gas inlet
19 Holding device
19a Holding piston
19b Return spring
19c Retaining pin
20 Contact surface
21 Dewar
22 Line to gas inlet
23 First sensor element
24 Additional sensor element
25; 25' Pneumatically operable elements
26 Shim system
30 Automated system
31 Robot gripper arm
32 Sample changer

The invention claimed is:

1. An NMR spectrometer comprising:
an NMR magnet system having a permanent magnet device for generating a $B_0$ field in a measuring volume, and a bore through a magnet center for introducing an NMR measurement sample in a substantially cylindrical sample tube, closed at least on its underside;
an RF coil for exciting nuclear spins in the NMR measurement sample, the RF coil being arranged outside a cylindrical temperature control pipe that extends through the measuring volume and into which the sample tube can be introduced for an NMR measurement in such a way that between an inner circumference of the cylindrical temperature control pipe and an outer circumference of the sample tube there is a continuous annular air gap, through which, at least in an NMR measuring operation, temperature control gas for controlling a temperature of the NMR measurement sample in the sample tube can be guided from a temperature control system through a gas inlet; and
a holding device that is movable relative to the sample tube in a measuring position thereof, and is located in the NMR spectrometer at the end of the sample tube opposite the gas inlet during the NMR measuring operation, wherein:
in a first operating position, the holding device does not touch the sample tube, in order to enable its introduction into its measuring position in the NMR spectrometer;
in a second operating position, during the NMR measurement in the measuring position thereof, the holding device holds the sample tube on its outer circumference in a force-locking and/or form-locking manner with a force or static friction Fr acting axially on the sample tube, such that $$F_f > F_{dynamic} - F_{weight},$$

where $F_{dynamic}$ is the buoyancy force on the sample tube generated by the dynamic pressure of the temperature control gas flowing onto the sample tube during NMR measurement operation and $F_{weight}$ is a weight of the sample tube; and
in a third operating position, the holding device releases the sample tube for removal from the NMR spectrometer.

2. The NMR spectrometer according to claim 1, wherein a contact surface between the sample tube and the holding device has a friction coefficient of μ>0.3, and $$F_f = \mu * F_{clamp},$$

where $F_{clamp}$ is a clamping force acting radially on the sample tube.

3. The NMR spectrometer according to claim 1, wherein the continuous annular air gap between the inner circumference of the cylindrical temperature control pipe and the outer circumference of the sample tube in the measuring position of the sample tube has a radial opening width between 0.1 mm and 1 mm.

4. The NMR spectrometer according to claim 1, wherein the temperature control gas has a volume flow of at least 1 l/min and at most 20 l/min.

5. The NMR spectrometer according to claim 1, further comprising a sample changer that automatically supplies the NMR spectrometer with sample tubes, the sample changer having a storage container for storing a plurality of sample tubes and a device for transferring the sample tubes into the measuring volume and removing them from the measuring volume.

6. The NMR spectrometer according to claim 5, wherein the holding device functions as said device for transferring and removing sample tubes, and the NMR spectrometer and the sample changer are components of an automated system having a robot gripper arm.

7. The NMR spectrometer according to claim 1, further comprising a dewar that at least partially surrounds a line leading from the temperature control system to the gas inlet.

8. The NMR spectrometer according to claim 1, further comprising a first sensor element for determining the presence of the sample tube.

9. The NMR spectrometer according to claim 8, further comprising a further sensor element for determining a current operating position of the holding device.

10. The NMR spectrometer according to claim 1, wherein the holding device has a holding piston that can be subjected to a force by means of compressed air or motor drives, which force then moves the holding piston against the sample tube counter to a restoring force.

11. The NMR spectrometer according to claim 1, wherein the holding device comprises holding cheeks that can clamp at least parts of the outer circumference of the sample tube in a tong-like manner.

12. The NMR spectrometer according to claim 1, wherein the holding device has an iris diaphragm.

13. The NMR spectrometer according to claim 1, wherein the holding device comprises a blocking element which, in the second operating position, in the manner of a lid over the end of the sample tube opposite the gas inlet, prevents the sample tube from moving out of the measuring position in the axial direction.

14. The NMR spectrometer according to claim 1, wherein the holding device has pneumatically actuable elements that can apply radial pressure to the sample tube in its measuring position.

15. A method for operating an NMR spectrometer according to claim 9, the method comprising:
 (a) transferring the holding device into the first operating position;
 (b) inserting a sample tube having an NMR measurement sample through the bore to its measuring position in the measuring volume;
 (c) detecting the presence of the sample tube in the measuring position by with the first sensor element;
 (d) holding the sample tube with the holding device;
 (e) checking the current presence of the second operating position of the holding device by means of the further sensor element;
 (f) releasing a temperature control gas stream for controlling the temperature of the NMR measurement sample;
 (g) performing an NMR measurement on the NMR measurement sample; and
 (h) transferring the holding device to the third operating position and removing the sample tube from the spectrometer.

\* \* \* \* \*